United States Patent
Dietrich et al.

(10) Patent No.: US 12,341,489 B2
(45) Date of Patent: Jun. 24, 2025

(54) SURFACE-ACOUSTIC-WAVE (SAW) FILTER WITH A COMPENSATION LAYER HAVING MULTIPLE DENSITIES

(71) Applicant: RF360 SINGAPORE PTE. LTD., Republic Plaza (SG)

(72) Inventors: Marc Konstantin Dietrich, Munich (DE); Ingo Bleyl, Munich (DE); Matthias Knapp, Munich (DE); Guenter Scheinbacher, Baldham (DE); Benno Blaschke, Munich (DE)

(73) Assignee: RF360 Singapore Pte. Ltd., Republic Plaza (SG)

( * ) Notice: Subject to any disclaimer, the term of this patent is extended or adjusted under 35 U.S.C. 154(b) by 923 days.

(21) Appl. No.: 17/473,642

(22) Filed: Sep. 13, 2021

(65) Prior Publication Data
US 2023/0084491 A1    Mar. 16, 2023

(51) Int. Cl.
*H03H 9/25*    (2006.01)
*H03H 3/08*    (2006.01)
*H03H 9/02*    (2006.01)
*H03H 9/64*    (2006.01)

(52) U.S. Cl.
CPC ............... *H03H 9/25* (2013.01); *H03H 3/08* (2013.01); *H03H 9/02574* (2013.01); *H03H 9/64* (2013.01)

(58) Field of Classification Search
CPC .. H03H 9/02842; H03H 9/25; H03H 9/02834; H03H 9/64; H03H 3/08; H03H 3/10; H03H 9/02866; H03H 9/02574
See application file for complete search history.

(56) References Cited

U.S. PATENT DOCUMENTS

| | | | |
|---|---|---|---|
| 2014/0152146 A1 | 6/2014 | Kimura et al. | |
| 2015/0069882 A1* | 3/2015 | Umeda | H03H 9/02574 310/313 B |
| 2017/0063332 A1* | 3/2017 | Gilbert | H03H 9/02574 |
| 2017/0063339 A1* | 3/2017 | Burak | H03H 9/02574 |
| 2017/0168026 A1* | 6/2017 | Morton | H03H 9/02102 |
| 2019/0393856 A1 | 12/2019 | Iwamoto et al. | |
| 2020/0228092 A1* | 7/2020 | Nagatomo | H03H 9/589 |
| 2020/0389147 A1 | 12/2020 | Iwamoto | |
| 2021/0265972 A1* | 8/2021 | Daimon | H03H 9/02574 |
| 2023/0308079 A1* | 9/2023 | Daimon | H03H 9/02559 |

OTHER PUBLICATIONS

International Search Report and Written Opinion—PCT/EP2022/073606—ISA/EPO—Jan. 3, 2023, 13 pages.

* cited by examiner

*Primary Examiner* — J. San Martin
(74) *Attorney, Agent, or Firm* — Polsinelli

(57) ABSTRACT

An apparatus is disclosed for a surface-acoustic-wave filter with a compensation layer having multiple densities. In an example aspect, the apparatus includes at least one surface-acoustic-wave filter with a piezoelectric layer, a substrate layer, and a compensation layer positioned between the piezoelectric layer and the substrate layer. The compensation layer includes a first portion having a first density and a second portion having a second density. The second density is greater than the first density. The first portion is positioned closer to the piezoelectric layer as compared to the second portion. The second portion is positioned closer to the substrate layer as compared to the first portion.

30 Claims, 9 Drawing Sheets

SURFACE-ACOUSTIC-WAVE (SAW) FILTER WITH A COMPENSATION LAYER HAVING MULTIPLE DENSITIES

TECHNICAL FIELD

This disclosure relates generally to wireless transceivers and other components that employ filters and, more specifically, to a surface-acoustic-wave (SAW) filter with a compensation layer having multiple densities.

BACKGROUND

Electronic devices use radio-frequency (RF) signals to communicate information. These radio-frequency signals enable users to talk with friends, download information, share pictures, remotely control household devices, and receive global positioning information. To transmit or receive the radio-frequency signals within a given frequency band, the electronic device may use filters to pass signals within the frequency band and to suppress (e.g., attenuate) jammers or noise having frequencies outside of the frequency band. It can be challenging, however, to design a filter that provides filtering for high-frequency applications, including those that utilize frequencies above 2 gigahertz (GHz), while preventing or reducing spurious modes across a frequency response of the filter.

SUMMARY

An apparatus is disclosed that implements a surface-acoustic-wave (SAW) filter with a compensation layer having multiple densities. In example implementations, the surface-acoustic-wave filter includes a compensation layer positioned between a piezoelectric layer and a substrate layer. Different portions of the compensation layer have different densities. A portion that is proximate to the piezoelectric layer has a lower density than another portion that is proximate to the substrate layer. These densities suppress excitation of spurious modes that resonate between the piezoelectric layer, the compensation layer, and the substrate layer due to reflections at surface boundaries. By tailoring the multiple densities of the compensation layer, at least one spurious mode can be suppressed without significantly increasing an excitation of another spurious mode. With the ability to directly suppress one of the spurious modes, designers have more flexibility and options for suppressing spurious modes across a frequency response of the surface-acoustic-wave filter.

In an example aspect, an apparatus for filtering is disclosed. The apparatus includes at least one surface-acoustic-wave (SAW) filter with a piezoelectric layer, a substrate layer, and a compensation layer positioned between the piezoelectric layer and the substrate layer. The compensation layer includes a first portion having a first density and a second portion having a second density. The second density is greater than the first density. The first portion is positioned closer to the piezoelectric layer as compared to the second portion. The second portion is positioned closer to the substrate layer as compared to the first portion.

In an example aspect, an apparatus for filtering is disclosed. The apparatus includes at least one surface-acoustic-wave (SAW) filter with a piezoelectric layer and a substrate layer. The surface-acoustic-wave filter also includes compensation means for suppressing a spurious mode of the surface-acoustic-wave filter caused by reflections at a first surface of the compensation means and at a second surface of the compensation means. The compensation means has a first density at the first surface and a second density as the second surface. The second density is greater than the first density. The compensation means is positioned between the piezoelectric layer and the substrate layer such that the first surface is proximate to the piezoelectric layer and the second surface is proximate to the substrate layer.

In an example aspect, a method manufacturing a surface-acoustic-wave filter is disclosed. The method includes providing a substrate layer. The method also includes providing a compensation layer on a surface of the substrate layer. The compensation layer has a first surface and a second surface that is opposite the first surface. The providing of the compensation layer includes forming the compensation layer such that a density of the compensation layer is higher at the second surface relative to the first surface.

In an example aspect, an apparatus is disclosed. The apparatus includes a substrate layer and a compensation layer disposed on a side of the substrate layer. The compensation layer includes two surfaces on opposite sides of the compensation layer. The two surfaces include a first surface and a second surface. The first surface has a first density. The second surface has a second density that is greater than the first density. The second surface is closer to the substrate layer as compared to the first surface.

BRIEF DESCRIPTION OF DRAWINGS

FIG. 5-1 illustrates an example compensation layer having two layers associated with different densities.

FIG. 5-2 illustrates an example compensation layer having three layers associated with different densities.

DETAILED DESCRIPTION

Figure 1:
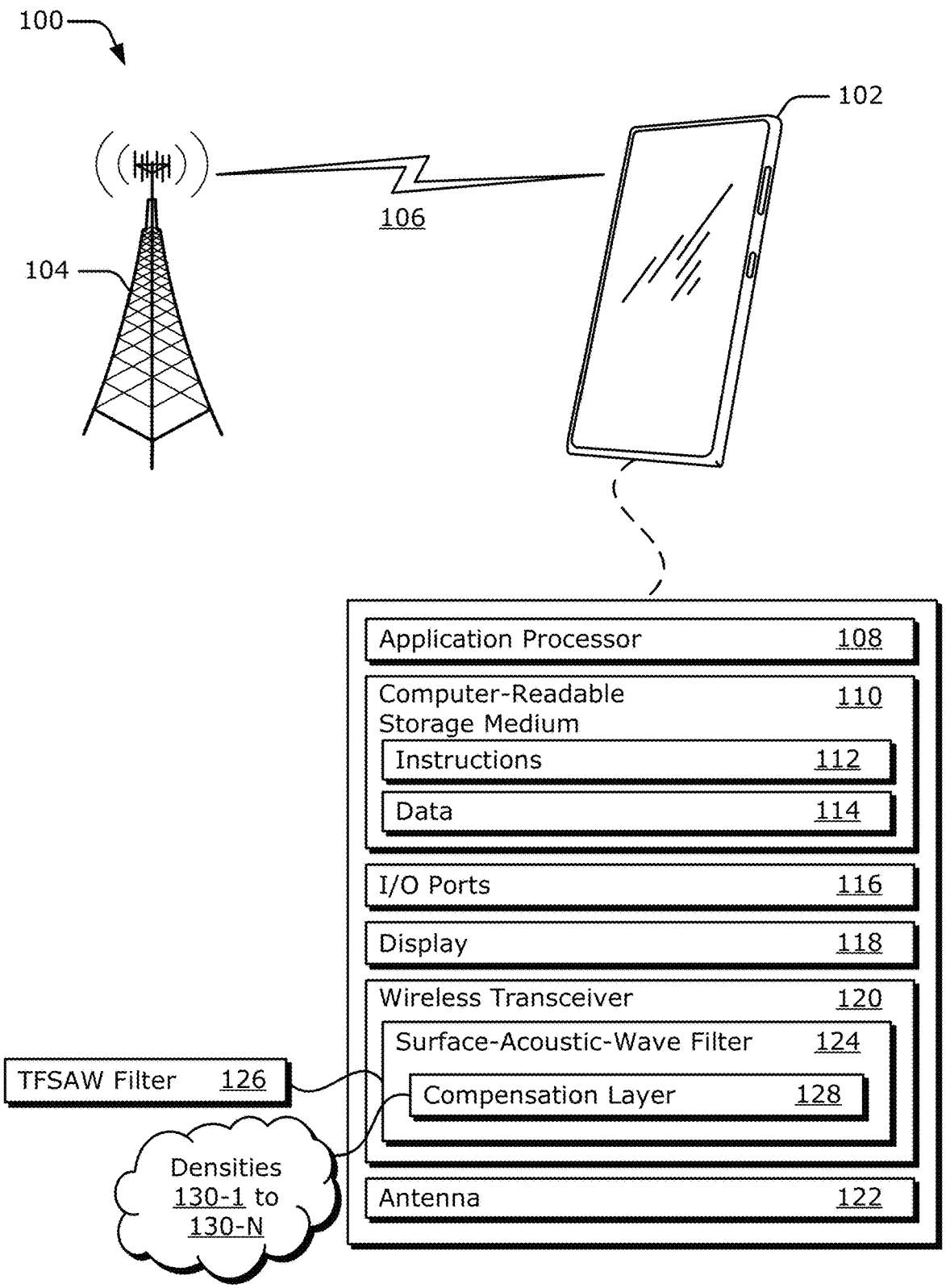
FIG. 1 illustrates an example operating environment for a surface-acoustic-wave filter with a compensation layer having multiple densities.

To transmit or receive radio-frequency signals within a given frequency band, an electronic device may use filters to pass signals within the frequency band and to suppress (e.g., attenuate) jammers or noise having frequencies outside of the frequency band. Electroacoustic devices (e.g., "acoustic filters") can be used to filter high-frequency signals in many applications, such as those with frequencies that are greater than 100 megahertz (MHz). An acoustic filter is tuned to pass certain frequencies (e.g., frequencies within its passband) and attenuate other frequencies (e.g., frequencies that are outside of its passband). Using a piezoelectric material as a vibrating medium, the acoustic filter operates by transforming an electrical signal wave that is propagating along an electrical conductor into an acoustic wave (e.g., an acoustic signal wave) that forms across the piezoelectric material. The acoustic wave is then converted back into an electrical filtered signal. The acoustic filter can include an electrode structure that transforms or converts between the electrical and acoustic waves.

The acoustic wave propagates across the piezoelectric material at a velocity having a magnitude that is significantly less than that of the propagation velocity of the electrical wave. Generally, the magnitude of the propagation velocity of a wave is proportional to a size of a wavelength of the wave. Consequently, after conversion of the electrical signal wave into the acoustic signal wave, the wavelength of the acoustic signal wave is significantly smaller than the wavelength of the electrical signal wave. The resulting smaller wavelength of the acoustic signal wave enables filtering to be performed using a smaller filter device. This permits acoustic filters to be used in space-constrained devices, including portable electronic devices such as cellular phones.

It can be challenging, however, to design an acoustic filter that can provide filtering for high-frequency applications, including those that utilize frequencies above 2 gigahertz (GHz), while maintaining or reducing spurious modes (e.g., spurious wave modes) below certain magnitude thresholds across a frequency response of the acoustic filter. A spurious mode is an undesired mode, which can degrade performance of the acoustic filter. Some filter designs customize a geometry of the electrode structure of the acoustic filter to attenuate a spurious mode. As an example, fingers within the electrode structure can have varying widths or heights across the length of the fingers. Other filter designs tailor thicknesses of a piezoelectric layer and/or a compensation layer within the surface-acoustic-wave filter to suppress a spurious mode.

Although these techniques can suppress one or more spurious modes, sometimes this comes at the expense of increasing excitation of another spurious mode. This tradeoff can make it challenging to utilize the acoustic filter for wide-band applications, for supporting concurrent operations of different types of wireless communications (e.g., Bluetooth®, Wi-Fi®, or cellular), or for supporting techniques such as carrier aggregation. Additionally or alternatively, utilizing these techniques can degrade performance aspects of the surface-acoustic-wave filter, such as temperature compensation. Therefore, another tradeoff may be made between suppressing a spurious mode or degrading the performance of the surface-acoustic-wave filter.

To address these challenges, a surface-acoustic-wave (SAW) filter with a compensation layer having multiple densities is described. In example implementations, the surface-acoustic-wave filter includes a compensation layer positioned between a piezoelectric layer and a substrate layer. Different portions of the compensation layer have different densities. A portion that is proximate to the piezoelectric layer has a lower density than another portion that is proximate to the substrate layer. These different densities suppress excitation of spurious modes that resonate between the piezoelectric layer, the compensation layer, and the substrate layer due to reflections at surface boundaries. By tailoring the multiple densities of the compensation layer, at least one spurious mode can be suppressed (e.g., attenuated) without significantly increasing an excitation of another spurious mode. With the ability to directly suppress one of the spurious modes, designers have more flexibility and options for suppressing spurious modes across a frequency response of the surface-acoustic-wave filter. These techniques can be used and provide benefits for acoustic filters that support frequencies above 2 GHz as well as for other acoustic filters that support frequencies below 2 GHz.

FIG. 1 illustrates an example environment 100 for a surface-acoustic-wave filter with a compensation layer having multiple densities. In the environment 100, a computing device 102 communicates with a base station 104 through a wireless communication link 106 (wireless link 106). In this example, the computing device 102 is depicted as a smartphone. However, the computing device 102 can be implemented as any suitable computing or electronic device, such as a modem, a cellular base station, a broadband router, an access point, a cellular phone, a gaming device, a navigation device, a media device, a laptop computer, a desktop computer, a tablet computer, a wearable computer, a server, a network-attached storage (NAS) device, a smart appliance or other internet of things (IoT) device, a medical device, a vehicle-based communication system, a radar, a radio apparatus, and so forth.

The base station 104 communicates with the computing device 102 via the wireless link 106, which can be implemented as any suitable type of wireless link. Although depicted as a tower of a cellular network, the base station 104 can represent or be implemented as another device, such as a satellite, a server device, a terrestrial television broadcast tower, an access point, a peer-to-peer device, a mesh network node, and so forth. Therefore, the computing device 102 may communicate with the base station 104 or another device via a wireless connection.

The wireless link 106 can include a downlink of data or control information communicated from the base station 104 to the computing device 102, an uplink of other data or control information communicated from the computing device 102 to the base station 104, or both a downlink and an uplink. The wireless link 106 can be implemented using any suitable communication protocol or standard, such as 2nd-generation (2G), 3rd-generation (3G), 4th-generation (4G), or 5th-generation (5G) cellular; IEEE 802.11 (e.g., Wi-Fi®); IEEE 802.15 (e.g., Bluetooth®); IEEE 802.16 (e.g., WiMAX®); and so forth. In some implementations, the wireless link 106 may wirelessly provide power and the base station 104 or the computing device 102 may comprise a power source.

As shown, the computing device 102 includes an application processor 108 and a computer-readable storage medium 110 (CRM 110). The application processor 108 can include any type of processor, such as a multi-core processor, that executes processor-executable code stored by the CRM 110. The CRM 110 can include any suitable type of data storage media, such as volatile memory (e.g., random access memory (RAM)), non-volatile memory (e.g., Flash memory), optical media, magnetic media (e.g., disk), and so forth. In the context of this disclosure, the CRM 110 is implemented to store instructions 112, data 114, and other information of the computing device 102, and thus does not include transitory propagating signals or carrier waves.

The computing device 102 can also include input/output ports 116 (I/O ports 116) and a display 118. The I/O ports 116 enable data exchanges or interaction with other devices, networks, or users. The I/O ports 116 can include serial ports (e.g., universal serial bus (USB) ports), parallel ports, audio ports, infrared (IR) ports, user interface ports such as a touchscreen, and so forth. The display 118 presents graphics of the computing device 102, such as a user interface associated with an operating system, program, or application. Alternatively or additionally, the display 118 can be implemented as a display port or virtual interface, through which graphical content of the computing device 102 is presented.

A wireless transceiver 120 of the computing device 102 provides connectivity to respective networks and other electronic devices connected therewith. The wireless transceiver 120 can facilitate communication over any suitable type of wireless network, such as a wireless local area network (WLAN), peer-to-peer (P2P) network, mesh network, cellular network, wireless wide-area-network (WWAN), and/or wireless personal-area-network (WPAN). In the context of the example environment 100, the wireless transceiver 120 enables the computing device 102 to communicate with the base station 104 and networks connected therewith. However, the wireless transceiver 120 can also enable the computing device 102 to communicate "directly" with other devices or networks.

The wireless transceiver 120 includes circuitry and logic for transmitting and receiving communication signals via an antenna 122. Components of the wireless transceiver 120 can include amplifiers, switches, mixers, analog-to-digital converters, filters, and so forth for conditioning the communication signals (e.g., for generating or processing signals). The wireless transceiver 120 can also include logic to perform in-phase/quadrature (I/Q) operations, such as synthesis, encoding, modulation, decoding, demodulation, and so forth. In some cases, components of the wireless transceiver 120 are implemented as separate transmitter and receiver entities. Additionally or alternatively, the wireless transceiver 120 can be realized using multiple or different sections to implement respective transmitting and receiving operations (e.g., separate transmit and receive chains). In general, the wireless transceiver 120 processes data and/or signals associated with communicating data of the computing device 102 over the antenna 122.

In the example shown in FIG. 1, the wireless transceiver 120 includes at least one surface-acoustic-wave filter 124. In some implementations, the wireless transceiver 120 includes multiple surface-acoustic-wave filters 124, which can be formed from surface-acoustic-wave resonators arranged in series, in parallel, in a ladder structure, in a lattice structure, or some combination thereof. The surface-acoustic-wave filter 124 can be a thin-film surface-acoustic-wave filter 126 (TFSAW filter 126).

The surface-acoustic-wave filter 124 includes a compensation layer 128 having multiple densities 130-1 to 130-N, where N represents a positive integer. In addition to enabling the surface-acoustic-wave filter 124 to achieve a target temperature coefficient of frequency (TCF), the compensation layer 128 can provide spurious mode suppression for the surface-acoustic-wave filter 124. In particular, the compensation layer 128 can suppress a spurious mode associated with reflections at boundaries of the compensation layer 128. The surface-acoustic-wave filter 124 is further described with respect to FIG. 2.

Figure 2:
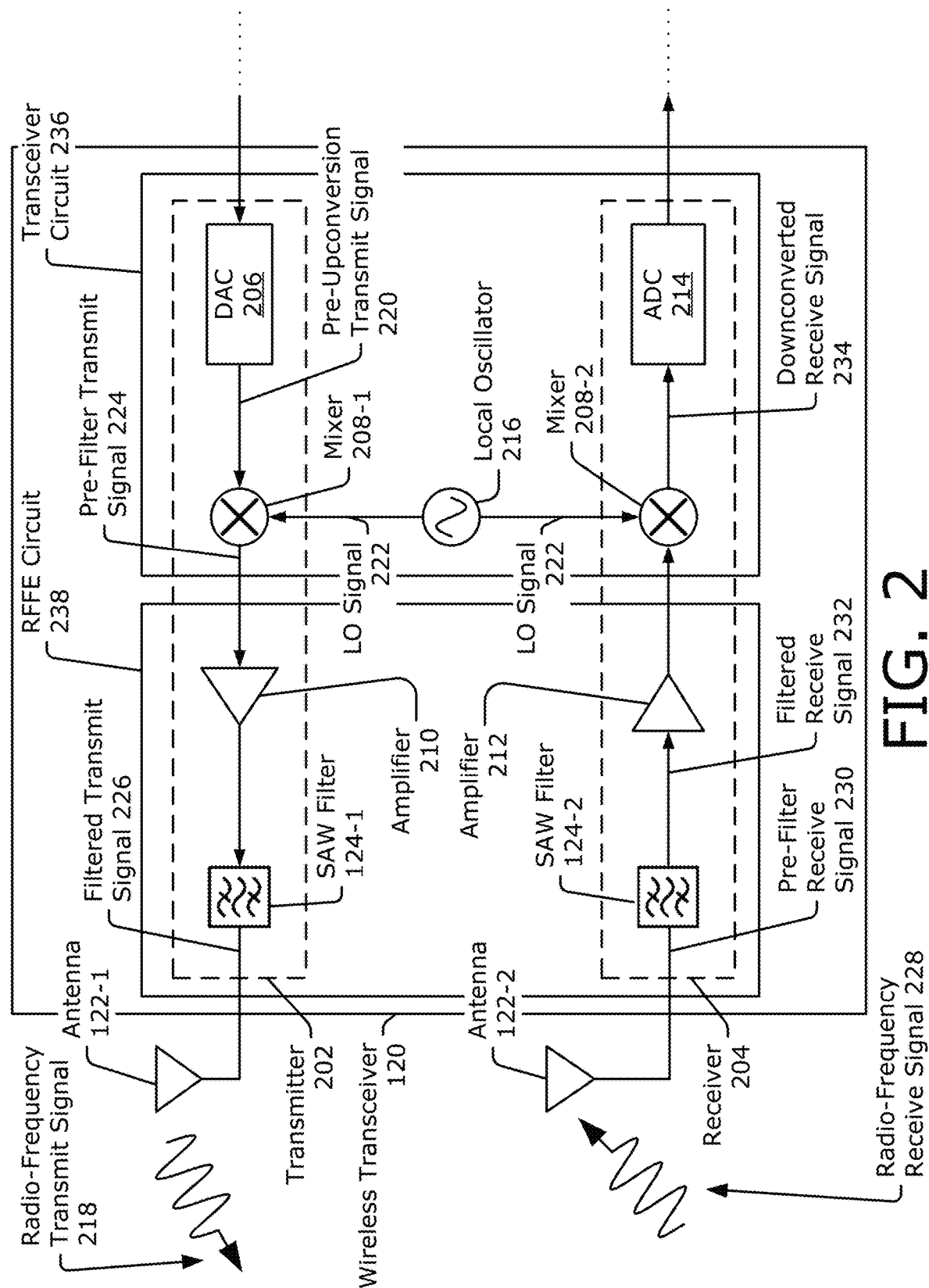
FIG. 2 illustrates an example wireless transceiver including at least one surface-acoustic-wave filter with a compensation layer having multiple densities.

FIG. 2 illustrates an example wireless transceiver 120. In the depicted configuration, the wireless transceiver 120 includes a transmitter 202 and a receiver 204, which are respectively coupled to a first antenna 122-1 and a second antenna 122-2. In other implementations, the transmitter 202 and the receiver 204 can be connected to a same antenna through a duplexer (not shown). The transmitter 202 is shown to include at least one digital-to-analog converter 206 (DAC 206), at least one first mixer 208-1, at least one amplifier 210 (e.g., a power amplifier), and at least one first surface-acoustic-wave filter 124-1. The receiver 204 includes at least one second surface-acoustic-wave filter 124-2, at least one amplifier 212 (e.g., a low-noise amplifier), at least one second mixer 208-2, and at least one analog-to-digital converter 214 (ADC 214). The first mixer 208-1 and the second mixer 208-2 are coupled to a local oscillator 216. Although not explicitly shown, the digital-to-analog converter 206 of the transmitter 202 and the analog-to-digital converter 214 of the receiver 204 can be coupled to the application processor 108 (of FIG. 1) or another processor associated with the wireless transceiver 120 (e.g., a modem).

In some implementations, the wireless transceiver 120 is implemented using multiple circuits (e.g., multiple integrated circuits), such as a transceiver circuit 236 and a radio-frequency front-end (RFFE) circuit 238. As such, the components that form the transmitter 202 and the receiver 204 are distributed across these circuits. As shown in FIG. 2, the transceiver circuit 236 includes the digital-to-analog converter 206 of the transmitter 202, the mixer 208-1 of the transmitter 202, the mixer 208-2 of the receiver 204, and the analog-to-digital converter 214 of the receiver 204. In other implementations, the digital-to-analog converter 206 and the analog-to-digital converter 214 can be implemented on another separate circuit that includes the application processor 108 or the modem. The radio-frequency front-end circuit 238 includes the amplifier 210 of the transmitter 202, the surface-acoustic-wave filter 124-1 of the transmitter 202, the surface-acoustic-wave filter 124-2 of the receiver 204, and the amplifier 212 of the receiver 204.

During transmission, the transmitter 202 generates a radio-frequency transmit signal 218, which is transmitted using the antenna 122-1. To generate the radio-frequency transmit signal 218, the digital-to-analog converter 206 provides a pre-upconversion transmit signal 220 to the first mixer 208-1. The pre-upconversion transmit signal 220 can be a baseband signal or an intermediate-frequency signal. The first mixer 208-1 upconverts the pre-upconversion transmit signal 220 using a local oscillator (LO) signal 222 provided by the local oscillator 216. The first mixer 208-1 generates an upconverted signal, which is referred to as a pre-filter transmit signal 224. The pre-filter transmit signal 224 can be a radio-frequency signal and include some noise or unwanted frequencies, such as a harmonic frequency. The amplifier 210 amplifies the pre-filter transmit signal 224 and passes the amplified pre-filter transmit signal 224 to the first surface-acoustic-wave filter 124-1.

The first surface-acoustic-wave filter 124-1 filters the amplified pre-filter transmit signal 224 to generate a filtered transmit signal 226. As part of the filtering process, the first surface-acoustic-wave filter 124-1 attenuates the noise or unwanted frequencies within the pre-filter transmit signal 224. The transmitter 202 provides the filtered transmit signal 226 to the antenna 122-1 for transmission. The transmitted filtered transmit signal 226 is represented by the radio-frequency transmit signal 218.

During reception, the antenna 122-2 receives a radio-frequency receive signal 228 and passes the radio-frequency receive signal 228 to the receiver 204. The second surface-acoustic-wave filter 124-2 accepts the received radio-frequency receive signal 228, which is represented by a pre-filter receive signal 230. The second surface-acoustic-wave filter 124-2 filters any noise or unwanted frequencies within the pre-filter receive signal 230 to generate a filtered receive signal 232.

The amplifier 212 of the receiver 204 amplifies the filtered receive signal 232 and passes the amplified filtered receive signal 232 to the second mixer 208-2. The second mixer 208-2 downconverts the amplified filtered receive signal 232 using the local oscillator signal 222 to generate the downconverted receive signal 234. The analog-to-digital converter 214 converts the downconverted receive signal 234 into a digital signal, which can be processed by the application processor 108 or another processor associated with the wireless transceiver 120 (e.g., the modem).

FIG. 2 illustrates one example configuration of the wireless transceiver 120. Other configurations of the wireless transceiver 120 can support multiple frequency bands and share an antenna 122 across multiple transceivers. One of ordinary skill in the art can appreciate the variety of other configurations for which surface-acoustic-wave filters 124 may be included. For example, the surface-acoustic-wave filters 124 can be integrated within duplexers or diplexers of the wireless transceiver 120. Example implementations of the surface-acoustic-wave filter 124-1 or 124-2 are further described with respect to FIGS. 3 and 4.

Figure 3:
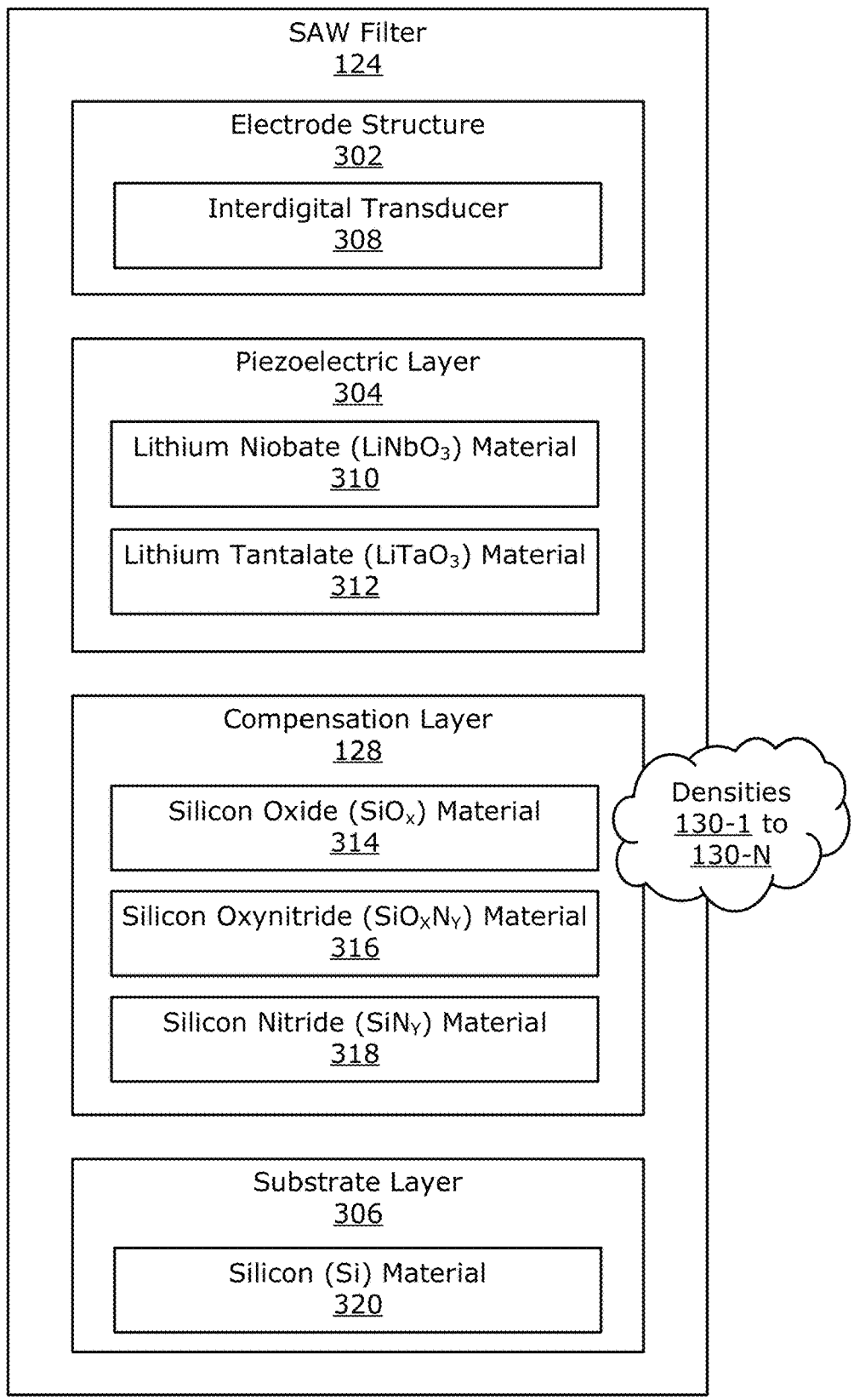
FIG. 3 illustrates example components of a surface-acoustic-wave filter with a compensation layer having multiple densities.

FIG. 3 illustrates example components of the surface-acoustic-wave filter 124. In the depicted configuration, the surface-acoustic-wave filter 124 includes at least one electrode structure 302, at least one piezoelectric layer 304, the compensation layer 128, and at least one substrate layer 306. The electrode structure 302 comprises a conductive material, such as metal, and can include one or more layers. The one or more layers can include one or more metal layers and can optionally include one or more adhesion layers. As an example, the metal layers can be composed of aluminium (Al), copper (Cu), silver (Ag), gold (Au), tungsten (W), or some combination or doped version thereof. The adhesion layers can be composed of chromium (Cr), titanium (Ti), molybdenum (Mo), or some combination thereof.

The electrode structure 302 can include one or more interdigital transducers 308. The interdigital transducer 308 converts an electrical signal into an acoustic wave and converts the acoustic wave into a filtered electrical signal. An example interdigital transducer 308 is further described with respect to FIG. 4. Although not explicitly shown, the electrode structure 302 can also include two or more reflectors. In an example implementation, the interdigital transducer 308 is arranged between two reflectors, which reflect the acoustic wave back towards the interdigital transducer 308.

In example implementations, the piezoelectric layer 304 is formed using lithium niobate (LiNbO$_3$) material 310, lithium tantalate (LiTaO$_3$) material 312, quartz, aluminium nitride (AlN), aluminium scandium nitride (AlScN), or some combination thereof. The lithium niobate material 310 can alternatively be referred to as a lithium niobate layer, a lithium niobate plate, a lithium niobate film, or a lithium niobate substrate. Lithium niobate is a type of crystal composed of niobium, lithium, and oxygen. The lithium niobate material 310 can be composed of this lithium niobate crystal, or a similar type of crystal, such as doped lithium niobate. Other types of mixed crystals that have a similar symmetry as lithium niobate can also be used to form the lithium niobate material 310. Using the lithium niobate material 310, the piezoelectric layer 304 can have a density of approximately 4.6 grams per cubic centimeter (g/cm$^3$) in an example implementation.

The lithium tantalate material 312 can alternatively be referred to as a lithium tantalate layer, a lithium tantalate plate, a lithium tantalate film, or a lithium tantalate substrate. Lithium tantalate is a type of crystal composed of tantalum, lithium, and oxygen. The lithium tantalate material 312 can be composed of this lithium tantalate crystal, or a similar type of crystal, such as doped lithium tantalate. Other types of mixed crystals that have a similar symmetry as lithium tantalate can also be used to form the lithium tantalate material 312. Using the lithium tantalate material 312, the piezoelectric layer 304 can have a density of approximately 7.4 g/cm$^3$ in an example implementation.

The material of the piezoelectric layer 304 and the orientation of the propagation surface with respect to the crystal structure of the material affects several performance parameters. Example performance parameters include an electroacoustic coupling factor ($K^2$), the temperature coefficient of frequency, a mode or type of acoustic wave produced, and/or a velocity of the acoustic wave. The electroacoustic coupling factor characterizes an efficiency of the surface-acoustic-wave filter 124 in converting between electrical energy and mechanical energy. A filter with a higher electroacoustic coupling factor experiences less insertion loss over a wider frequency range and improved impedance matching than another filter with a lower electroacoustic coupling factor. The temperature coefficient of frequency characterizes an amount a resonant frequency or filter skirt of the filter changes in response to a change in temperature. A filter with a smaller absolute value of the temperature coefficient of frequency has a more stable frequency response over a range of temperatures compared to another filter with a larger absolute value of the temperature coefficient of frequency.

The compensation layer 128 can be formed using a silicon oxide (SiO$_X$) material 314 (e.g., SiO$_2$), a silicon oxynitride (SiO$_X$N$_Y$) material 316 (e.g., Si$_2$N$_2$O), a silicon nitride (SiN$_Y$) material 318 (e.g., Si$_3$N$_4$), or some combination thereof. The variables X and Y represent positive real numbers, which may or may not be equal to each other. The compensation layer 128 can be formed using a physical vapor deposition (PVD) process (e.g., a sputtering process) or a chemical vapor deposition (CVD) process. The chemical vapor deposition process can use tetraethylorthosilicate (TEOS) or silane (SiH$_4$). Example processes for forming the compensation layer 128 are further described with respect to FIG. 8.

Densities of these materials can vary based on the deposition process and by controlling aspects of the deposition process (e.g., by adjusting the gas relation, process pressure, and plasma power). In some cases, the density of the materials can be changed by at least 30%. As an example, the silicon oxide material 314 can have a density between approximately 1.8 and 2.2 g/cm$^3$. The silicon nitride material 318 can have a density between approximately 1.7 and 3.2 g/cm$^3$. The silicon oxynitride material 316 can have a density between approximately 1.8 and 2.7 g/cm$^3$. To form the silicon oxynitride material 316, such as Si$_2$N$_2$O, silicon dioxide (SiO$_2$) can be sputtered with a nitride gas.

In general, the compensation layer 128 can include a dielectric film with densities 130-1 to 130-N that are less than a density of the piezoelectric layer 304. In addition to suppressing a spurious mode, the compensation layer 128 enables the surface-acoustic-wave filter 124 to achieve a target temperature coefficient of frequency based on a thickness of the piezoelectric layer 304. In some implementations, a thickness of the compensation layer 128 can also be tailored to provide mode suppression (e.g., suppress a spurious plate mode).

The compensation layer 128 has multiple densities 130-1 to 130-N across its thickness. To achieve these multiple densities 130-1 to 130-N, the compensation layer 128 can be formed using at least one of the materials 314, 316, or 318 and varying the density of this material. For example, the compensation layer 128 can be composed of the silicon oxide material 314 having different densities across a thickness of the compensation layer 128.

Alternatively, the compensation layer 128 can be formed using at least two materials having different densities. In this case, the compensation layer 128 can use a combination of two or more of the materials 314, 316, and 318. For example, the compensation layer 128 can include the silicon oxide material 314 and the silicon nitride material 318. A density of the silicon oxide material 314 can be less than a density of the silicon nitride material 318.

As another option, the compensation layer 128 can be formed using one of the materials 314, 316, or 318 and varying a doping concentration of an element with this material to provide different densities. Example elements can include fluorine (F), carbon (C), phosphorus (P), chlorine (Cl), or hydrogen (H). The silicon oxide material 314, for instance, can be doped with carbon and hydrogen to form SiCOH. In general, the doping concentration changes a phase velocity of a propagating acoustic wave, which can also contribute to spurious mode suppression.

In general, the multiple densities 130-1 to 130-N enable the compensation layer 128 to reduce the reflections to suppress excitation of the spurious mode. Various implementations of the compensation layer 128 are further described with respect to FIGS. 5-1 to 6.

The substrate layer 306 can include one or more sublayers that can support passivation, power handling, mode suppression, and so forth. In some implementations, the substrate layer 306 includes the compensation layer 128 as a sublayer. The substrate layer 306 can enable the acoustic wave to form across the surface of the piezoelectric layer 304 and reduce the amount of energy that leaks into the substrate layer 306.

In general, the substrate layer 306 is composed of material that is non-conducting and provides isolation. For example, the substrate layer 306 can be formed using silicon (Si) material 320 (e.g., a doped high-resistive silicon material). Alternatively, the substrate layer 306 can be formed using sapphire material (e.g., aluminium oxide ($Al_2O_3$)), silicon carbide (SiC) material, fused silica material, quartz, glass, diamond, or some combination thereof.

In some aspects, the surface-acoustic-wave filter 124 can be considered a resonator. Sometimes the surface-acoustic-wave filter 124 can be connected to other resonators associated with different layer stacks than the surface-acoustic-wave filter 124. In other aspects, the surface-acoustic-wave filter 124 can be implemented as multiple interconnected resonators, which use the same layers (e.g., the piezoelectric layer 304 and/or the compensation layer 128). The electrode structure 302, the piezoelectric layer 304, the compensation layer 128, and the substrate layer 306 are further described with respect to FIG. 4.

Figure 4:
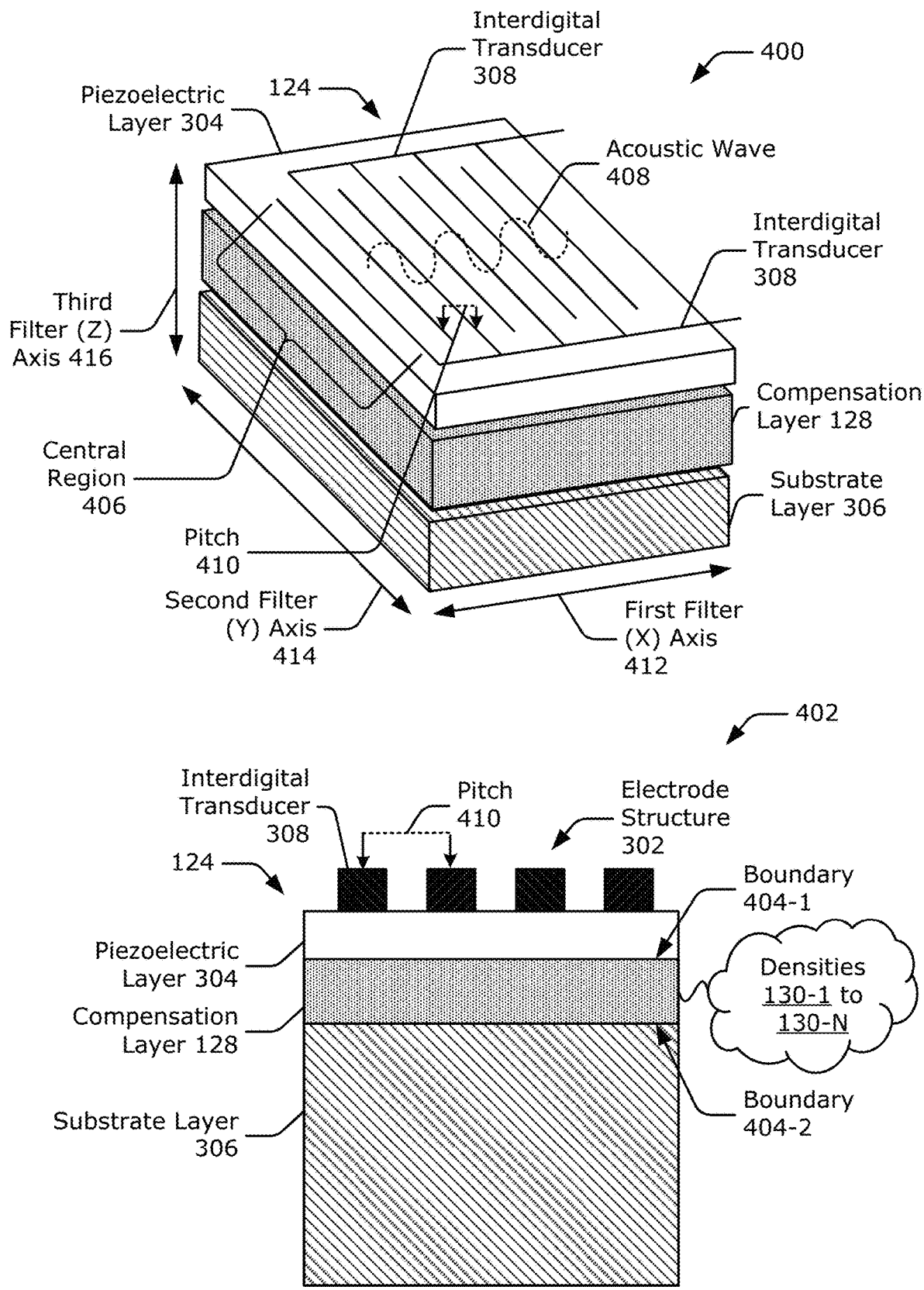
FIG. 4 illustrates an example implementation of a surface-acoustic-wave filter with a compensation layer having multiple densities.

FIG. 4 illustrates an example implementation of the surface-acoustic-wave filter 124 with the compensation layer 128 having multiple densities 130-1 to 130-N. A three-dimensional perspective view 400 of the surface-acoustic-wave filter 124 is shown at the top of FIG. 4, and a two-dimensional cross-section view 402 of the surface-acoustic-wave filter 124 is shown at the bottom of FIG. 4.

In the depicted configuration shown in the two-dimensional cross-section view 402, the compensation layer 128 is disposed between the piezoelectric layer 304 and the substrate layer 306. In this manner, the compensation layer 128 is adjacent to the piezoelectric layer 304 and the substrate layer 306. In particular, a first surface of the compensation layer 128 abuts the piezoelectric layer 304 to form a first boundary 404-1. A second surface of the compensation layer 128 abuts the substrate layer 306 to form a second boundary 404-2. The electrode structure 302 is disposed on top of the piezoelectric layer 304 and includes the interdigital transducer 308. Although not explicitly shown in FIG. 4, the electrode structure 302 can also include one or more other interdigital transducers 308 and two or more reflectors.

In the three-dimensional perspective view 400, the interdigital transducer 308 is shown to have two comb-shaped electrode structures with fingers extending towards each other from two busbars (e.g., conductive segments or rails). The electrode fingers are arranged in an interlocking manner in between the two busbars of the interdigital transducer 308 (e.g., arranged in an interdigitated manner). In other words, the fingers connected to a first busbar extend towards a second busbar but do not connect to the second busbar. As such, there is a gap between the ends of these fingers and the second busbar. Likewise, fingers connected to the second busbar extend towards the first busbar but do not connect to the first busbar. There is therefore a gap between the ends of these fingers and the first busbar.

In the direction along the fingers, there is an overlap region including a central region 406 where a portion of one finger overlaps with a portion of an adjacent finger. This central region 406, including the overlap, may be referred to as the aperture, track, or active region where electric fields are produced between fingers to cause an acoustic wave 408 to form at least in this region of the piezoelectric layer 304.

A physical periodicity of a spacing between adjacent ones of the fingers is referred to as a pitch 410 of the interdigital transducer 308. The pitch 410 may be indicated in various ways. For example, in certain aspects, the pitch 410 may correspond to a magnitude of a distance between consecutive fingers of the interdigital transducer 308 in the central region 406. This distance may be defined, for example, as the distance between center points of each of the fingers. The distance may be generally measured between a right (or left) edge of one finger and the right (or left) edge of an adjacent finger when the fingers have uniform widths. In certain aspects, an average of distances between adjacent fingers of the interdigital transducer 308 may be used for the pitch 410.

The frequency at which the piezoelectric layer 304 vibrates is referred to as a main-resonance frequency of the electrode structure 302. The frequency is determined at least in part by the pitch 410 of the interdigital transducer 308 and other properties of the surface-acoustic-wave filter 124.

It should be appreciated that while a certain number of fingers are illustrated in FIG. 4, the number of fingers and the lengths and width of the fingers and busbars may be different in an actual implementation. Such parameters can depend on the particular application and desired filter characteristics. In addition, the surface-acoustic-wave filter 124 can include multiple interconnected electrode structures 302, with each including multiple interdigital transducers 308 to achieve a desired passband (e.g., can include multiple interconnected resonators or interdigital transducers 308 in series or parallel connections to form a desired filter transfer function).

Although not shown, each reflector within the electrode structure 302 can have two busbars and a grating structure of conductive fingers that each connect to both busbars. In some implementations, a pitch of the reflector can be similar to or the same as the pitch 410 of the interdigital transducer 308 to reflect the acoustic wave 408 in the resonant frequency range.

In the three-dimensional perspective view 400, the surface-acoustic-wave filter 124 is defined by a first filter (X) axis 412, a second filter (Y) axis 414, and a third filter (Z)

axis 416. The first filter axis 412 and the second filter axis 414 are parallel to planar surfaces of the piezoelectric layer 304, the compensation layer 128, and the substrate layer 306. The second filter axis 414 is perpendicular to the first filter axis 412. The third filter axis 416 is normal (e.g., perpendicular) to the planar surfaces of the piezoelectric layer 304, the compensation layer 128, and the substrate layer 306. The busbars of the interdigital transducer 308 are oriented to be parallel to the first filter axis 412. Also, an orientation of the piezoelectric layer 304 causes an acoustic wave 408 to mainly form in a direction of the first filter axis 412. As such, the acoustic wave 408 forms so as to have a direction of propagation that is substantially perpendicular to the direction of the fingers and substantially parallel to the busbars of the interdigital transducer 308.

During operation, the surface-acoustic-wave filter 124 accepts a radio-frequency signal, such as the pre-filter transmit signal 224 or the pre-filter receive signal 230 shown in FIG. 2. The electrode structure 302 excites an acoustic wave 408 on the piezoelectric layer 304 using the inverse piezoelectric effect. For example, the interdigital transducer 308 in the electrode structure 302 generates an alternating electric field based on the accepted radio-frequency signal. The piezoelectric layer 304 enables the acoustic wave 408 to be formed in response to the alternating electric field generated by the interdigital transducer 308. In other words, the piezoelectric layer 304 causes, at least partially, the acoustic wave 408 to form responsive to electrical stimulation by one or more interdigital transducers 308.

The acoustic wave 408 propagates across the piezoelectric layer 304 and interacts with the interdigital transducer 308 or another interdigital transducer within the electrode structure 302 (not shown in FIG. 4). In some implementations, two reflectors within the electrode structure 302 cause the acoustic wave 408 to be formed as a standing wave across a portion of the piezoelectric layer 304. In other implementations, the acoustic wave 408 propagates across the piezoelectric layer 304 from the interdigital transducer 308 to another interdigital transducer.

Using the piezoelectric effect, the electrode structure 302 generates a filtered radio-frequency signal based on the propagated surface acoustic wave 408. In particular, the piezoelectric layer 304 generates an alternating electric field due to the mechanical stress generated by the propagation of the acoustic wave 408. The alternating electric field induces an alternating current in the other interdigital transducer or the interdigital transducer 308. This alternating current forms the filtered radio-frequency signal, which is provided at an output of the surface-acoustic-wave filter 124. The filtered radio-frequency signal can include the filtered transmit signal 226 or the filtered receive signal 232 of FIG. 2.

Portions of the acoustic wave 408 can reflect off the boundaries 404-1 and 404-2, which can excite a spurious mode. To suppress the excitation of this spurious mode, the compensation layer 128 has multiple densities 130-1 to 130-N with a lower density proximate to the piezoelectric layer 304 (e.g., density 130-1) and a higher density proximate to the substrate layer 306 (e.g., density 130-N). The density 130-N can be approximately 20% greater than the density 130-1. For example, the density 130-N can be approximately 20%, 30%, 40%, 50%, 60%, 70%, or 75% more than the density 130-1.

FIG. 4 illustrates an example implementation in which surfaces of the compensation layer 128 are in physical contact with the piezoelectric layer 304 and the substrate layer 306. The techniques for suppressing spurious modes using a compensation layer 128 with multiple densities 130-1 to 130-N can be generally applied to a variety of surface-acoustic-wave filters 124 in which the compensation layer 128 is positioned between the piezoelectric layer 304 and the substrate layer 306. For example, these techniques can also be applied to other implementations that include another layer between the compensation layer 128 and the piezoelectric layer 304 and/or an additional layer between the compensation layer 128 and the substrate layer 306. Example implementations of the compensation layer 128 are further described with respect to FIGS. 5-1, 5-2, and 6.

Figure 5:
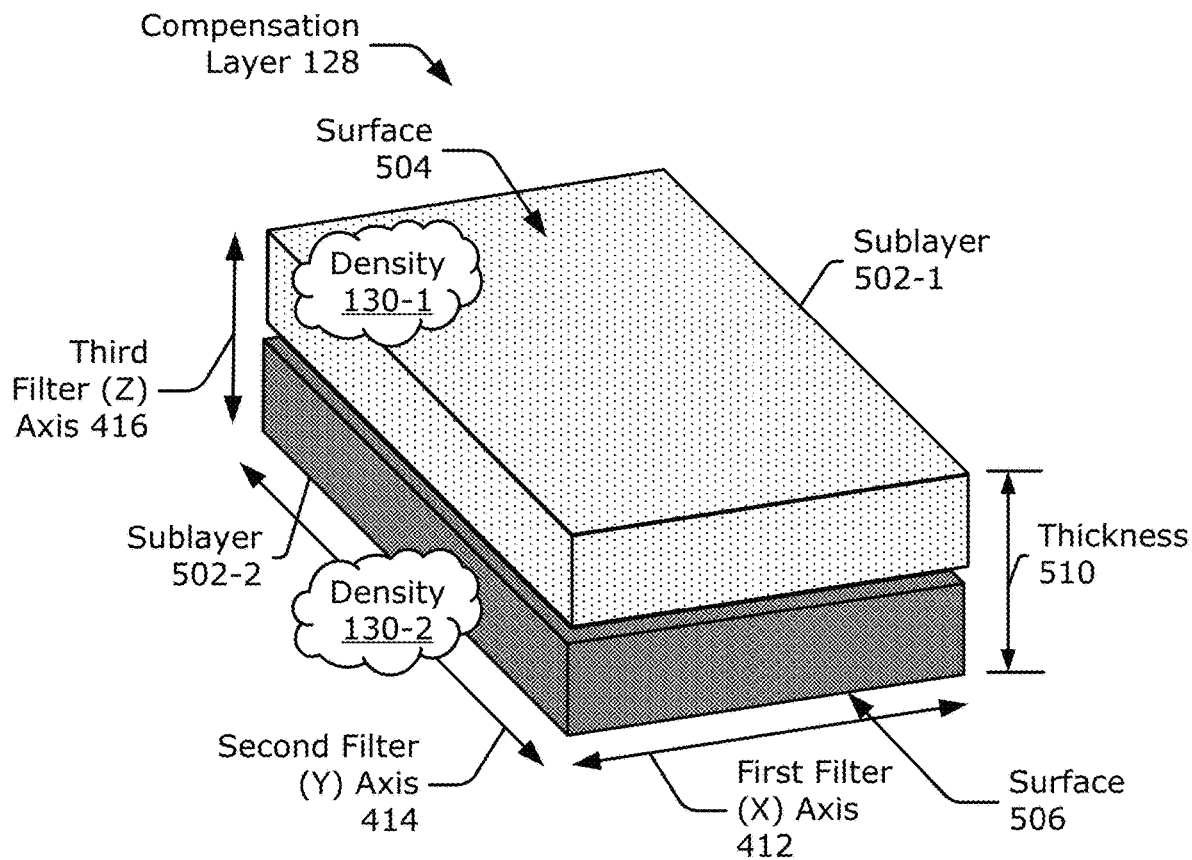
Figure 1:
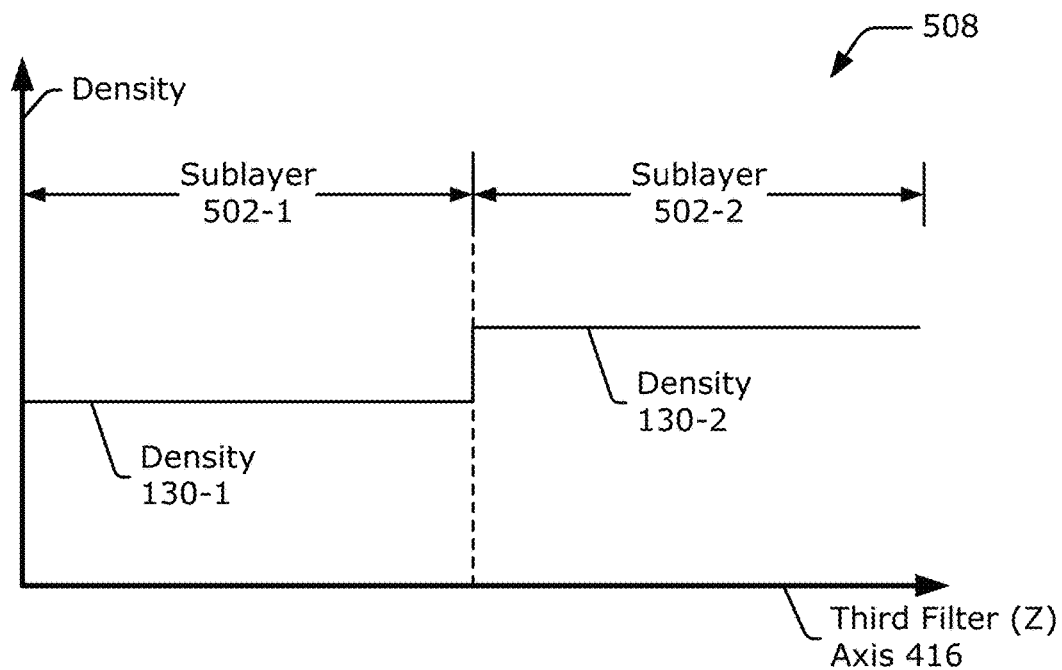
Figure 5:
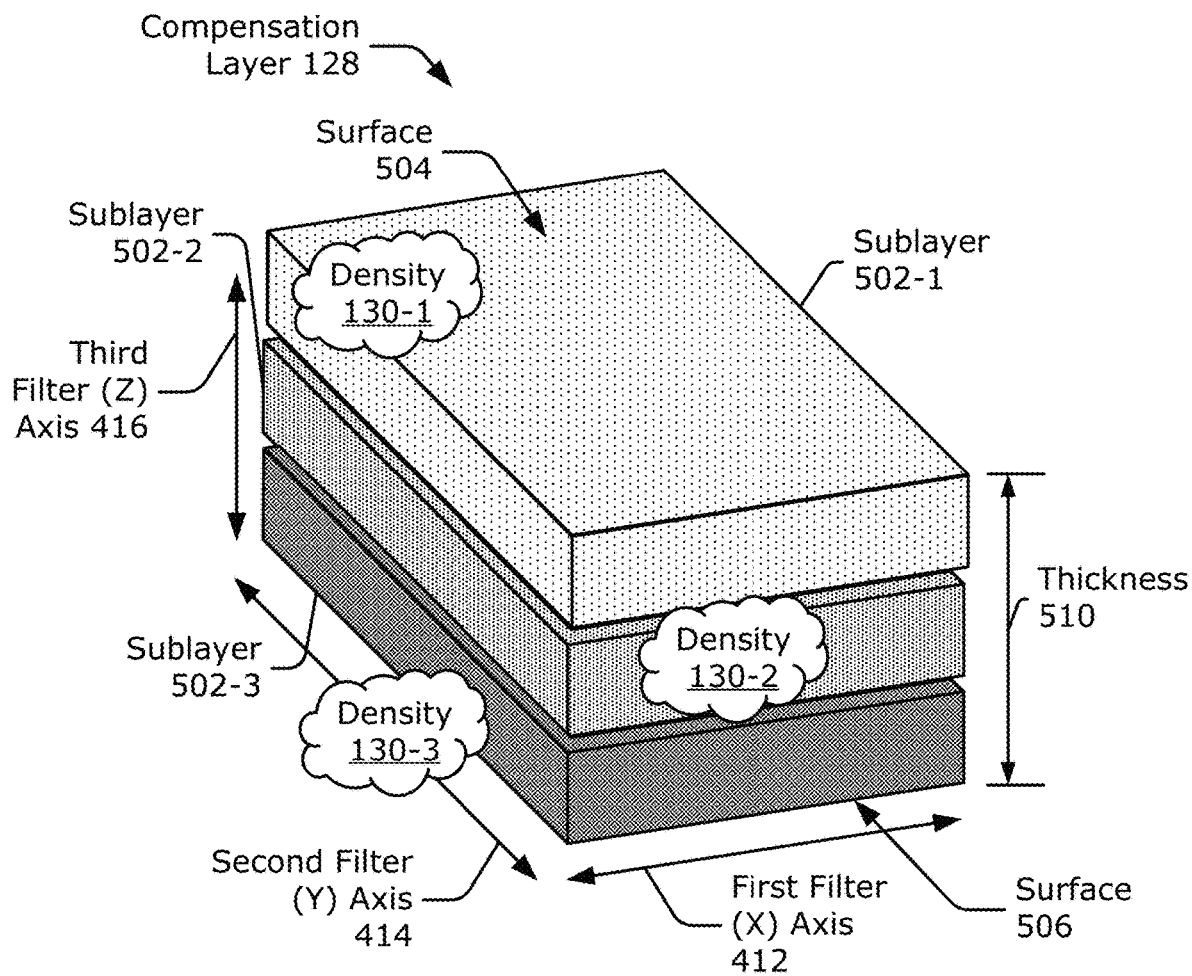
Figure 2:
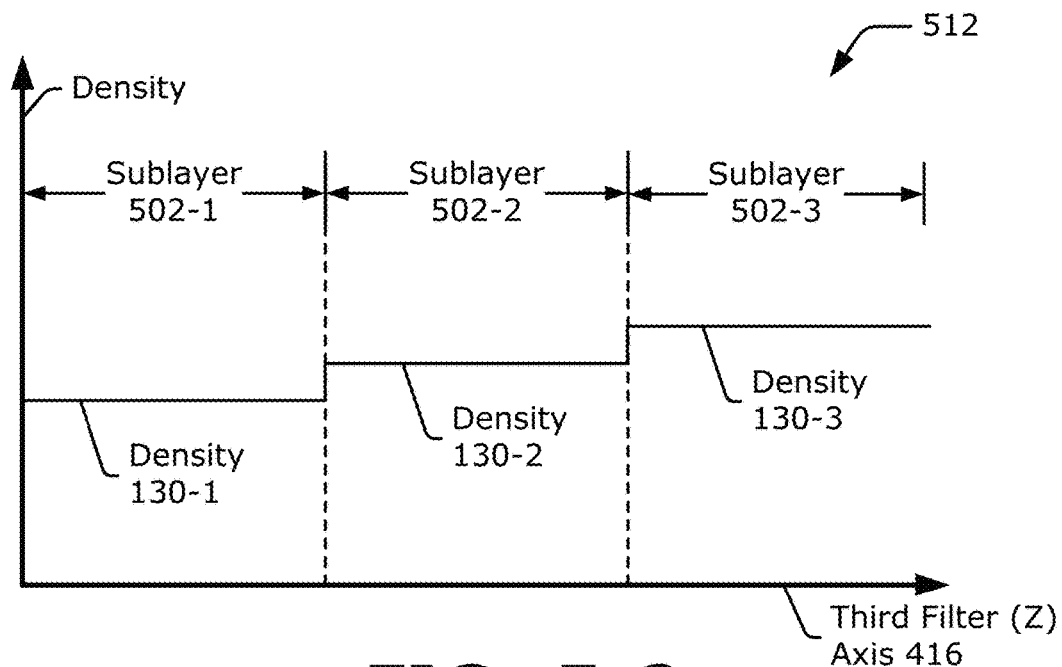

FIG. 5-1 illustrates an example compensation layer 128 having two sublayers 502-1 and 502-2 associated with respective densities 130-1 and 130-2. The sublayer 502-1 has a surface 504, which in some implementations abuts the piezoelectric layer 304 (of FIG. 4). The surface 504 forms part of the boundary 404-1. The sublayer 502-2 has a surface 506, which in some implementations abuts the substrate layer 306 (of FIG. 4). The surface 506 forms part of the boundary 404-2. The surfaces 504 and 506 can be considered opposite outer surfaces of the compensation layer 128 in this two-sublayer example.

In the depicted configuration, the sublayers 502-1 and 502-2 are shown to have relatively similar thicknesses. In other implementations, the sublayers 502-1 and 502-2 can have different thicknesses. The sublayers 502-1 and 502-2 can be formed using a same material (e.g., one of the materials 314, 316, or 318). Alternatively, the sublayers 502-1 and 502-2 can be formed using different materials (e.g., different ones of the materials 314, 316, and 318) or different doping concentrations.

In this example, each of the sublayers 502-1 and 502-2 have substantially uniform internal densities such that variations in density are within +/−1%. Consider a graph 508 at the bottom of FIG. 5-1 that shows the multiple densities of the compensation layer 128 along the third filter (Z) axis 416. Across a thickness of the sublayer 502-1 (e.g., across a portion of the third filter (Z) axis 416 associated with the sublayer 502-1), the density 130-1 is approximately constant. Likewise, the density 130-2 of the sublayer 502-2 is approximately constant across a thickness of the sublayer 502-2. In this manner, the density of the compensation layer 128 changes across a thickness 510 of the compensation layer 128. Although not shown in the graph 508, the densities 130-1 and 130-2 of the sublayers 502-1 and 502-2 can also be substantially uniform across the first filter (X) axis 412 and/or the second filter (Y) axis 414.

To enable suppression of a spurious mode, the density 130-2 of the sublayer 502-2 is greater than the density 130-1 of the sublayer 502-1. In general, the density 130-2 of the sublayer 502-2 can be at least 20% greater than the density 130-1. As an example, the sublayer 502-1 comprises a silicon oxide material 314, such as $SiO_2$, and the density 130-1 is approximately equal to 1.8 g/cm$^3$. Also, the sublayer 502-2 comprises another silicon oxide material 314, such as $SiO_2$, and the density 130-2 is approximately equal to 2.6 g/cm$^3$. In this example, the density 130-2 of the sublayer 502-2 is at least 40% greater than the density 130-1. Other implementations of the compensation layer 128 can use additional sublayers 502, as further described with respect to FIG. 5-2.

FIG. 5-2 illustrates an example compensation layer 128 having three sublayers 502-1 to 502-3 associated with respective densities 130-1 to 130-3. The sublayer 502-1 has a surface 504, which in some implementations abuts the piezoelectric layer 304 (of FIG. 4). The surface 504 forms part of the boundary 404-1. The sublayer 502-3 has a surface 506, which in some implementations abuts the substrate layer 306 (of FIG. 4). The surface 506 forms part of the boundary 404-2. The surfaces 504 and 506 can be considered opposite outer surfaces of the compensation layer 128 in this three-sublayer example.

In the depicted configuration, the sublayers 502-1 to 502-3 are shown to have relatively similar thicknesses. In other implementations, the sublayers 502-1 to 502-3 can have different thicknesses. The sublayers 502-1 to 502-3 can be formed using a same material (e.g., one of the materials 314, 316, or 318). Alternatively, the sublayers 502-1 to 502-3 can be formed using different materials (e.g., at least two of the materials 314, 316, and 318) or different doping concentrations.

In this example, the sublayers 502-1 to 502-3 have substantially uniform densities such that variations in density are within +/−1%. Consider a graph 512 at the bottom of FIG. 5-2, which shows the multiple densities of the compensation layer 128 along the third filter (Z) axis 416. Across a thickness of the sublayer 502-1 (e.g., across a portion of the third filter (Z) axis 416 associated with the sublayer 502-1), the density 130-1 is approximately constant. Likewise, the density 130-2 of the sublayer 502-2 is approximately constant across a thickness of the sublayer 502-2, and the density 130-3 of the sublayer 502-3 is approximately constant across a thickness of the sublayer 502-3. In this manner, the density of the compensation layer 128 changes across the thickness 510 of the compensation layer 128. Although not shown in the graph 512, the densities 130-1 to 130-3 of the sublayers 502-1 to 502-3 can also be substantially uniform across the first filter (X) axis 412 and/or the second filter (Y) axis 414.

To enable suppression of a spurious mode, the density 130-2 of the sublayer 502-2 is greater than the density 130-1 of the sublayer 502-1. Also, the density 130-3 of the sublayer 502-3 is greater than the density 130-2 of the sublayer 502-2. In example implementations, the density 130-2 of the sublayer 502-2 can be at least 10% greater than the density 130-1, and the density 130-3 of the sublayer 502-3 can be at least 20% greater than the density 130-1.

Other implementations of the compensation layer 128 can use more than three sublayers (e.g., 4, 5, or 6). In general, the density 130 of an Nth sublayer 502 associated with the surface 506 can be at least 20% greater than the density 130 of a first sublayer 502 associated with the surface 504. The densities 130 of the inner sublayers 502 (e.g., the other sublayers between the first and Nth sublayers 502) can be a percentage of the density 130 of the first sublayer 502 that is less than 20%.

Consider an example in which the compensation layer 128 includes five sublayers and a density of the fifth sublayer associated with the surface 506 is approximately 40% greater than a density of the first sublayer associated with the surface 504. In this case, the densities of the inner sublayers can be incrementally increased such that there is a same difference between densities of adjacent sublayers.

For example, the densities of the inner sublayers can increase by 10% such that the density of a second layer is approximately 10% more than the density 130-1, the density of a third layer is approximately 20% more than the density 130-1, and the density of a fourth layer is approximately 30% more than the density 130-1. In other words, an absolute value of a difference between densities of adjacent sublayers is approximately equal to the Nth sublayer's density divided by (N−1). In this example, the difference between densities 130 of adjacent sublayers 502 is relatively constant throughout the compensation layer 128. However, other implementations of the compensation layer 128 can have adjacent sublayers 502 with a density difference that changes based on the sublayer 502's position within the compensation layer 128.

In FIGS. 5-1 and 5-2, the density of the compensation layers 128 is relatively constant across each sublayer 502. In alternative implementations, the density 130 can change over a thickness of a sublayer 502, as further described with respect to FIG. 6.

Figure 6:
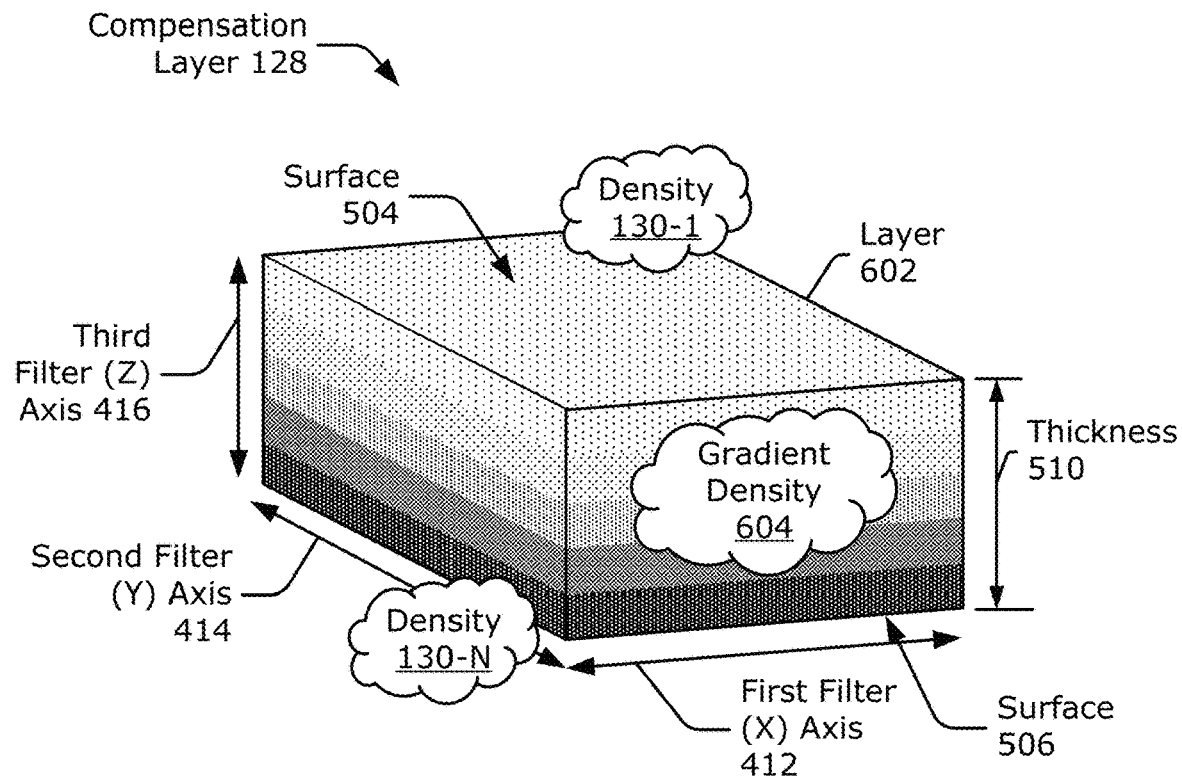
FIG. 6 illustrates an example compensation layer having a single layer with a gradient density.
Figure 6:
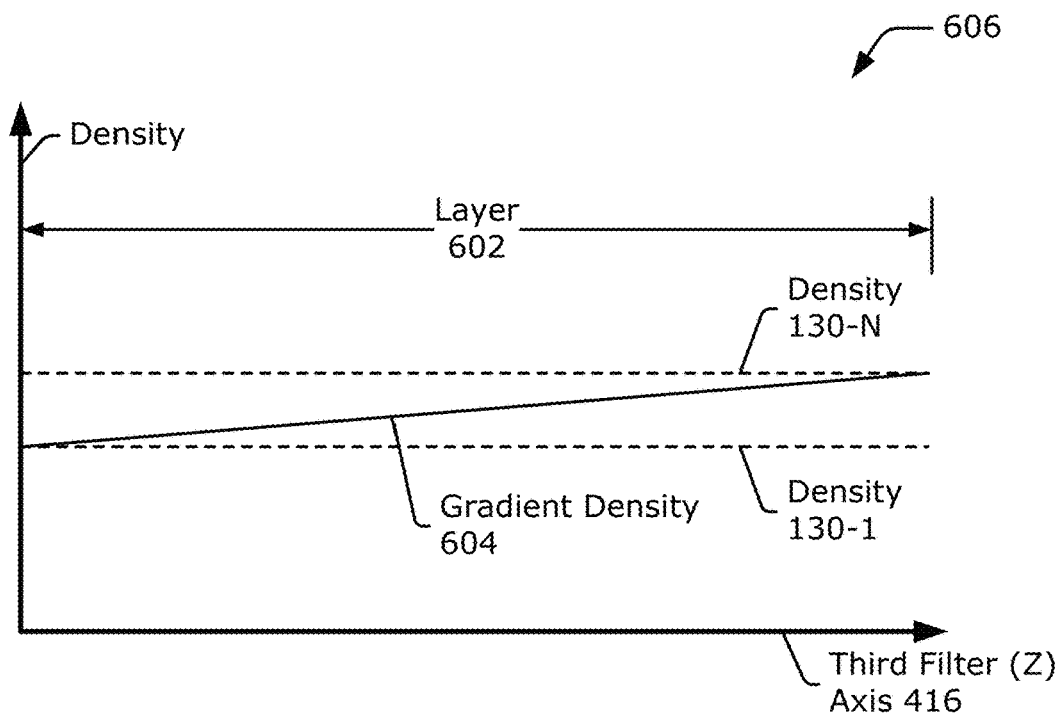

FIG. 6 illustrates an example compensation layer 128 having at least one layer 602 with a gradient density 604. The layer 602 has a surface 504, which in some implementations abuts the piezoelectric layer 304 (of FIG. 4). The surface 504 forms part of the boundary 404-1. The layer 602 also has a surface 506, which in some implementations abuts the substrate layer 306 (of FIG. 4). The surface 506 forms part of the boundary 404-2. The surface 504 and 506 can be considered opposite outer surface of the compensation layer 128 in this single-layer example.

In the depicted configuration, the layer 602 has a density that changes across the third filter (Z) axis 416. This variation in the density is represented by the gradient density 604. Consider a graph 606 at the bottom of FIG. 6, which shows the multiple densities of the compensation layer 128 along the third filter (Z) axis 416. Across a thickness of the layer 602, the gradient density 604 changes at a relatively constant rate. In this manner, the density of the compensation layer 128 changes across the thickness 510. Although not shown in the graph 606, the density 130 of the compensation layer 128 can be substantially uniform across the first filter (X) axis 412 and/or the second filter (Y) axis 414.

To enable suppression of a spurious mode, the gradient density 604 changes by at least 20% across the thickness 510. For example, the gradient density 604 can vary between the density 130-1 at the surface 504 and the density 130-N at the surface 506. The density 130-N of the layer 602 at the surface 506 can be at least 20% greater than the density 130-1 of the layer 602 at the surface 504.

Although FIG. 6 illustrates an example implementation in which the compensation layer 128 has a single layer 602 with a gradient density 604, other example implementations of the compensation layer 128 can include multiple sublayers with similar or different gradient densities 604. For example, the compensation layer 128 can include two sublayers, which have respective gradient densities 604.

As shown in FIGS. 5-1 to 6, there are a variety of different compensation layers 128 that can have multiple densities 130-1 to 130-N to suppress spurious modes. The compensation layers 128 in FIGS. 5-1 to 6 can be designed to have a particular thickness. In an example implementation, a total thickness 510 of the compensation layer 128 can be approximately 1,150 nanometers for implementations that support wavelengths between approximately 600 and 1,300 MHz. In another example implementation, the total thickness 510 of the compensation layer 128 can be approximately 530 nanometers for implementations that support wavelengths between approximately 1,100 to 2,800 MHz. In yet another example implementation, the total thickness 510 of the compensation layer 128 can be approximately 200 nanometers for implementations that support wavelengths between approximately 3,000 to 6,500 MHz. In general, the total thickness 510 of the compensation layer 128 divided by twice the pitch is equal to a value between approximately 0.2 and 0.35. An ability of the surface-acoustic-wave filter 124 to suppress spurious modes is further described with respect to FIG. 7.

Figure 7:
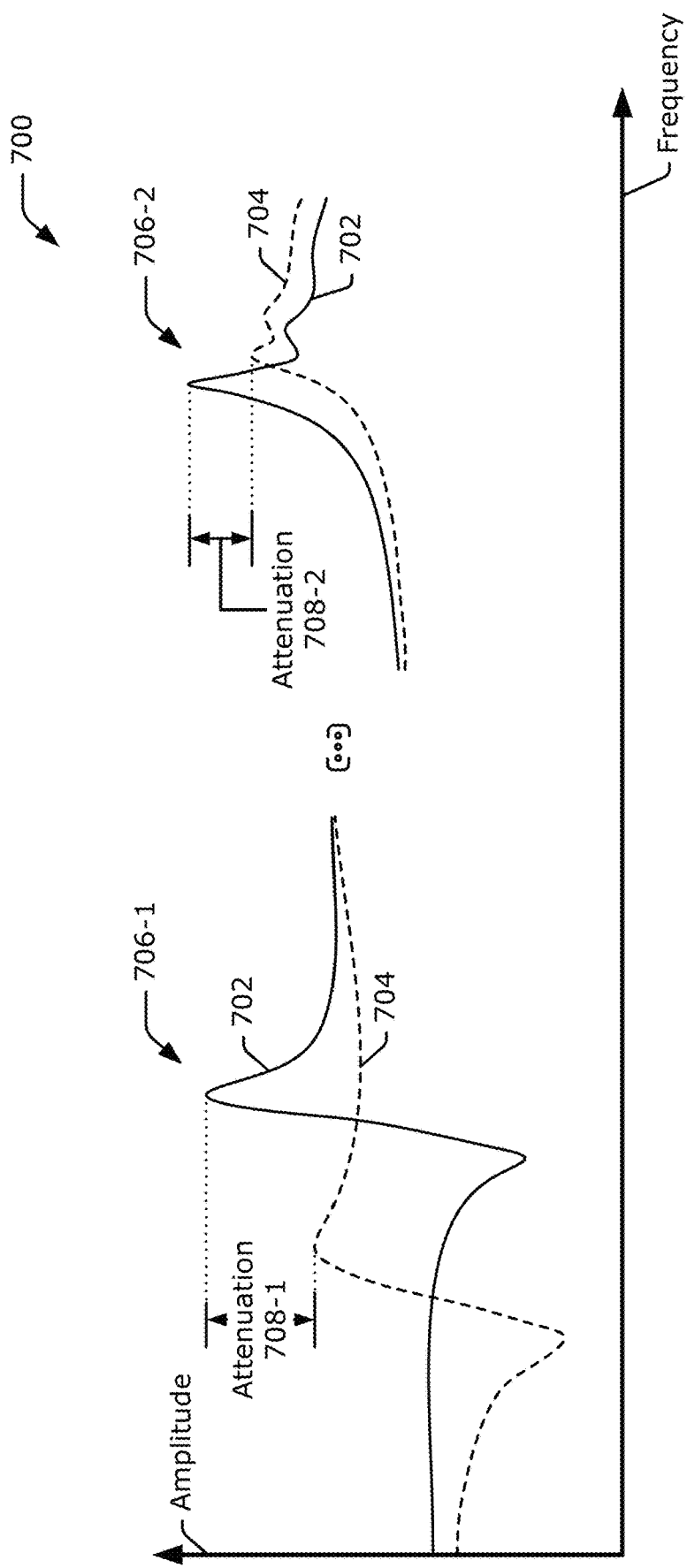
FIG. 7 depicts a graph that illustrates an example performance characteristic of a surface-acoustic-wave filter with a compensation layer having multiple densities.

FIG. 7 depicts a graph 700 that illustrates example performance characteristics of the surface-acoustic-wave filter

124 based on different implementations. In particular, the graph 700 depicts a frequency response 702 for a first surface-acoustic-wave filter with a compensation layer that has a relatively constant or uniform density (e.g., a density that does not substantially change across the third filter (Z) axis 416). The graph 700 also depicts a frequency response 704 for a second surface-acoustic-wave filter 124 with a compensation layer 128 that has multiple densities 130-1 to 130-N. The compensation layer 128 of the second surface-acoustic-wave filter 124 can include any of the compensation layers 128 described with respect to FIGS. 5-1 to 6.

In the first frequency response 702 and the second frequency response 704, spurious modes are generally observed at 706-1 and 706-2. In the second frequency response 704, the spurious modes are attenuated due to the multiple densities 130-1 to 130-N within the compensation layer 128. In some comparisons, the attenuation can be on the order of several decibels (dB) (e.g., approximately 5 dB, 10 dB, 20 dB, or more). At 706-1, for example, the second surface-acoustic-wave filter 124 attenuates the spurious mode of the second frequency response 704 by approximately 20 dB relative to the first frequency response 702. This attenuation is represented by attenuation 708-1. At 706-2, the second surface-acoustic-wave filter 124 attenuates the spurious mode of the second frequency response 704 by approximately 10 dB relative to the first frequency response 702. This attenuation is represented by attenuation 708-2.

In comparison with other spurious mode suppression techniques, the use of the compensation layer 128 with multiple densities 130-1 to 130-N enables attenuation of a spurious mode (e.g., the spurious mode at 706-1) without increasing excitation of another spurious mode (e.g., without increasing an amplitude of the spurious mode at 706-2). In some cases, as in the example shown in FIG. 7, the use of the compensation layer 128 with multiple densities 130-1 to 130-N enables suppression of multiple spurious modes (e.g., the spurious modes at 706-1 and 706-2).

Although described with respect to a general surface-acoustic-wave filter 124, the techniques described herein can also apply to particular types of surface-acoustic-wave filters 124, such as the thin-film surface-acoustic-wave filter 126. A layer stack of the thin-film surface-acoustic-wave filter 126 includes a piezoelectric layer and a substrate layer. In comparison to some surface-acoustic-wave filters, particularly those with bulk piezoelectric layers, a thickness of the piezoelectric layer within the thin-film surface-acoustic-wave filter 126 is substantially smaller relative to a thickness of the bulk piezoelectric layer of other surface-acoustic-wave filters. The thickness of the piezoelectric layer of the thin-film surface-acoustic-wave filter 126 is also substantially smaller than a thickness of the substrate layer of the thin-film surface-acoustic-wave filter 126. As an example, the thickness of the thin-film surface-acoustic-wave filter 126's piezoelectric layer can be less than 1% of the thickness of the substrate layer.

These techniques can generally be applied to any type of surface-acoustic-wave filters 126 with one or more compensation layers in the layer stack. The position of the compensation layer within the layer stack can be similar or different than the position illustrated in FIG. 4. For instance, another surface-acoustic-wave filter (e.g., a high-quality temperature-compensated filter (HQTCF)) can have a compensation layer with multiple densities disposed above the electrode structure 302 and the piezoelectric layer 304.

Figure 8:
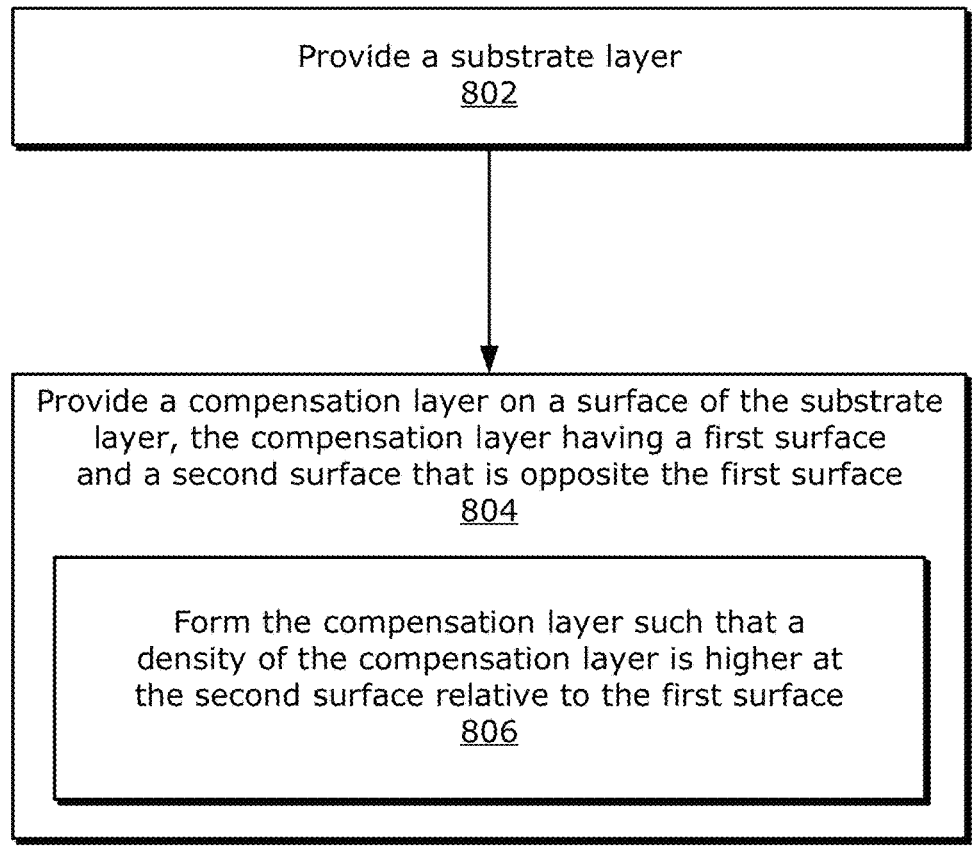
FIG. 8 is a flow diagram illustrating an example process for manufacturing a surface-acoustic-wave filter with a compensation layer having multiple densities.

FIG. 8 is a flow diagram illustrating an example process 800 for manufacturing a surface-acoustic-wave filter 124 with a compensation layer having multiple densities. The process 800 is described in the form of a set of blocks 802-806 that specify operations that can be performed. However, operations are not necessarily limited to the order shown in FIG. 8 or described herein, for the operations may be implemented in alternative orders or in fully or partially overlapping manners. Also, more, fewer, and/or different operations may be implemented to perform the process 800, or an alternative process. Operations represented by the illustrated blocks of the process 800 may be performed to manufacture the surface-acoustic-wave filter 124 (e.g., of FIGS. 1-4). More specifically, the operations of the process 800 may be performed, at least in part, to create a compensation layer 128 (e.g., of FIGS. 3 and 5-1 to 6) having at least two densities 130-1 to 130-N.

At 802, a substrate layer is provided. For example, the manufacturing process provides the substrate layer 306. The substrate layer 306 can be formed using silicon material 320. In general, the substrate layer 306 provides a support for other layers of the surface-acoustic-wave filter 124.

At 804, a compensation layer is provided on a surface of the substrate layer. The compensation layer has a first surface and a second surface that is opposite the first surface.

For example, the manufacturing processes provides the compensation layer 128 on a surface of the substrate layer 306. The surface of the substrate layer 306 can form a part of the boundary 404-2 shown in FIG. 4. The compensation layer 128 has the surface 504 and the surface 506, which is opposite the surface 504 as shown in FIG. 5-1. In general, the surface 506 is positioned closer to the substrate layer 306 while the surface 504 is positioned farther away from the substrate layer 306. The surface 506 can form another part of the boundary 404-2.

The manufacturing process can use a deposition process to form the compensation layer 128. Example deposition processes include a physical vapor deposition process (e.g., a sputtering process) or a chemical vapor deposition process.

At block 806, the compensation layer is formed such that a density of the compensation layer is higher at the second surface relative to the first surface. For example, the manufacturing process forms the compensation layer 128 to have a density 130-N at the surface 506 and a density 130-1 at the surface 504. The density 130-N is greater than the density 130-1. In some implementations, the density 130 of the compensation layer 128 decreases according to a step function, as shown in the graphs 508 and 512 of FIGS. 5-1 and 5-2, respectively. In other implementations, the density decreases gradually, (e.g., at a relatively constant rate) across the thickness of the compensation layer 128, as shown in the graph 606 of FIG. 6.

To form the compensation layer 128 with multiple densities 130-1 to 130-N, the manufacturing process can use a material and adjust the density of that material. Additionally or alternatively, the manufacturing process can use different materials having different densities. As another option, the manufacturing process can use various doping concentrations to adjust the velocity of the propagating wave, which can also provide spurious mode suppression.

In an example implementation, the compensation layer 128 is formed using the silicon nitride material 318 and a chemical vapor deposition process. A density of the silicon nitride material 318 can be adjusted by adjusting the gas relation, the process pressure, and/or the plasma power used during the chemical vapor deposition process. For example, the silicon nitride material 318 can be formed with a density of approximately 1.86 g/cm$^3$ using a gas relation of approximately 0.4, a process pressure of approximately 1,630 millitorr (mT), and a plasma power of approximately 200 watts. As another example, the silicon nitride material 318 can be formed with a density of approximately 2.44 g/cm$^3$ using a gas relation of approximately 4, a process pressure of approximately 500 mT, and a plasma power of approximately 300 watts. In general, the density of the silicon nitride material 318 can be increased by increasing the gas relation, decreasing the process pressure, and/or increasing the plasma power.

By forming the compensation layer 128 to have a higher density proximate to the substrate layer 306 and a lower density proximate to the piezoelectric layer 304, the surface-acoustic-wave filter 124 can suppress spurious modes that are caused by reflections at the surfaces 504 and 506. In some implementations, this type of surface-acoustic-wave filter 124 can attenuate at least one spurious mode by 20 dB compared to other surface-acoustic-wave filters that have a compensation layer with a relatively constant density. Also, the surface-acoustic-wave filter 124 can provide this attenuation without significantly increasing excitation of other spurious modes, as shown in FIG. 7.

Some aspects are described below.

Aspect 1: An apparatus comprising:
at least one surface-acoustic-wave (SAW) filter comprising:
a piezoelectric layer;
a substrate layer; and
a compensation layer positioned between the piezoelectric layer and the substrate layer, the compensation layer comprising:
a first portion having a first density; and
a second portion having a second density that is greater than the first density, the first portion positioned closer to the piezoelectric layer as compared to the second portion, the second portion positioned closer to the substrate layer as compared to the first portion.

Aspect 2: The apparatus of aspect 1, wherein:
the first portion of the compensation layer comprises a first sublayer of the compensation layer;
the second portion of the compensation layer comprises a second sublayer of the compensation layer;
the first sublayer is positioned between the piezoelectric layer and the second sublayer; and
the second sublayer is positioned between the first sublayer and the substrate layer.

Aspect 3: The apparatus of aspect 2, wherein the compensation layer comprises a third sublayer positioned between the first sublayer and the second sublayer, the third sublayer having a third density that is greater than the first density and less than the second density.

Aspect 4: The apparatus of any previous aspect, wherein:
the compensation layer has a first surface that abuts the piezoelectric layer and a second surface that abuts the substrate layer;
the first portion includes the first surface;
the second portion includes the second surface; and
the compensation layer has a gradient density that increases from the first density to the second density across a thickness of the compensation layer.

Aspect 5: The apparatus of any previous aspect, wherein:
the compensation layer comprises a dielectric film; and
the first density and the second density are less than a density of the piezoelectric layer.

Aspect 6: The apparatus of any previous aspect, wherein the second density is at least 20% greater than the first density.

Aspect 7: The apparatus of aspect 6, wherein the second density is at least 40% greater than the first density.

Aspect 8: The apparatus of any previous aspect, wherein the first portion of the compensation layer and the second portion of the compensation layer comprise a same material.

Aspect 9: The apparatus of any one of aspects 1 to 7, wherein the first portion of the compensation layer and the second portion of the compensation layer comprise different materials.

Aspect 10: The apparatus of any previous aspect, wherein:
the first portion of the compensation layer has a first doping concentration with an element;
the second portion of the compensation layer has a second doping concentration with the element; and
the second density is greater than the first density based on the second doping concentrating being greater than the first doping concentration.

Aspect 11: The apparatus of any previous aspect, wherein the compensation layer comprises a silicon oxide material.

Aspect 12: The apparatus of any previous aspect, wherein the compensation layer comprises a silicon oxynitride material.

Aspect 13: The apparatus of any previous aspect, wherein the compensation layer comprises a silicon nitride material.

Aspect 14: The apparatus of any previous aspect, wherein the substrate layer comprises a silicon material.

Aspect 15: The apparatus of any previous aspect, wherein:
the surface-acoustic-wave filter comprises multiple cascaded resonators; and
a resonator of the multiple resonators comprises the piezoelectric layer, the compensation layer, and the substrate layer.

Aspect 16: The apparatus of any previous aspect, further comprising:
a wireless transceiver coupled to at least one antenna, the wireless transceiver comprising the surface-acoustic-wave filter and configured to filter, using the surface-acoustic-wave filter, a wireless signal communicated via the at least one antenna.

Aspect 17: The apparatus of any previous aspect, wherein the surface-acoustic-wave filter comprises a thin-film surface-acoustic-wave filter.

Aspect 18: An apparatus comprising:
at least one surface-acoustic-wave (SAW) filter comprising:
a piezoelectric layer;
a substrate layer; and
compensation means for suppressing a spurious mode of the surface-acoustic-wave filter associated with reflections at a first surface of the compensation means and at a second surface of the compensation means, the compensation means having a first density at the first surface and a second density at the second surface, the second density being greater than the first density, the compensation means positioned between the piezoelectric layer and the substrate layer such that the first surface is proximate to the piezoelectric layer and the second surface is proximate to the substrate layer.

Aspect 19: The apparatus of aspect 18, wherein the compensation means comprises means for enabling the surface-acoustic-wave filter to achieve a target temperature coefficient of frequency.

Aspect 20: The apparatus of aspect 18 or 19, wherein the first density and the second density are less than a density of the piezoelectric layer.

Aspect 21: The apparatus of any one of aspects 18 to 20, wherein the second density is at least 20% greater than the first density.

Aspect 22: A method of manufacturing a surface-acoustic-wave filter, the method comprising:
providing a substrate layer; and
providing a compensation layer on a surface of the substrate layer, the compensation layer having a first surface and a second surface that is opposite the first surface, the providing of the compensation layer comprising:
forming the compensation layer such that a density of the compensation layer is higher at the second surface relative to the first surface.

Aspect 23: The method of aspect 22, wherein the forming of the compensation layer comprises forming multiple sublayers of the compensation layer, the multiple sublayers associated with different densities.

Aspect 24: The method of aspect 22 or 23, wherein the forming of the compensation layer comprises causing the compensation layer to have a gradient density that decreases across a thickness of the compensation layer from the second surface to the first surface.

Aspect 25: The method of any one of aspects 22 to 24, wherein the forming of the compensation layer comprises performing at least one of the following:
a physical vapor deposition process; or
a chemical vapor deposition process.

Aspect 26: The method of any one of aspects 22 to 25, further comprising:
providing a piezoelectric layer on the first surface of the compensation layer; and
providing an electrode structure on a surface of the piezoelectric layer.

Aspect 27: An apparatus comprising:
a substrate layer; and
a compensation layer disposed on a side of the substrate layer, the compensation layer comprising two surfaces on opposite sides of the compensation layer, the two surfaces comprising:
a first surface having a first density; and
a second surface having a second density that is greater than the first density, the second surface closer to the substrate layer as compared to the first surface.

Aspect 28: The apparatus of aspect 27, wherein:
the substrate layer comprises a silicon material; and
the compensation layer comprises at least one of the following:
a silicon oxide material;
a silicon oxynitride material; or
a silicon nitride material.

Aspect 29: The apparatus of aspect 28, wherein:
the compensation layer comprises at least one of the following:
the silicon oxide material doped with at least one first element;
the silicon oxynitride material doped with at least one second element; or
the silicon nitride material doped with at least third element; and
the at least one first element, the at least one second element, and the at least one third element each comprise at least one of the following:
carbon;
chlorine;
fluorine;
hydrogen; or
phosphorous.

Aspect 30: The apparatus of any one of aspects 27 to 29, further comprising a surface-acoustic-wave filter comprising:
a piezoelectric layer disposed on the first surface of the compensation layer;
the compensation layer; and
the substrate layer.

Unless context dictates otherwise, use herein of the word "or" may be considered use of an "inclusive or," or a term that permits inclusion or application of one or more items that are linked by the word "or" (e.g., a phrase "A or B" may be interpreted as permitting just "A," as permitting just "B," or as permitting both "A" and "B"). As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c). Further, items represented in the accompanying figures and terms discussed herein may be indicative of one or more items or terms, and thus reference may be made interchangeably to single or plural forms of the items and terms in this written description. Finally, although subject matter has been described in language specific to structural features or methodological operations, it is to be understood that the subject matter defined in the appended claims is not necessarily limited to the specific features or operations described above, including not necessarily being limited to the organizations in which features are arranged or the orders in which operations are performed.

What is claimed is:
1. An apparatus comprising:
at least one surface-acoustic-wave (SAW) filter comprising:
an interdigital transducer;
a piezoelectric layer;
a substrate layer; and
a compensation layer positioned between the piezoelectric layer and the substrate layer, the compensation layer comprising:
a first portion including a silicon oxide material having a first density; and
a second portion including a fluorine doped silicon oxide material having a second density that is greater than the first density, the first portion positioned closer to the piezoelectric layer as compared to the second portion, the second portion positioned closer to the substrate layer as compared to the first portion.

2. The apparatus of claim 1, wherein:
the first portion of the compensation layer comprises a first sublayer of the compensation layer;
the second portion of the compensation layer comprises a second sublayer of the compensation layer;
the first sublayer is positioned between the piezoelectric layer and the second sublayer; and
the second sublayer is positioned between the first sublayer and the substrate layer.

3. The apparatus of claim 2, wherein the compensation layer comprises a third sublayer positioned between the first sublayer and the second sublayer, the third sublayer having a third density that is greater than the first density and less than the second density.

4. The apparatus of claim 1, wherein:
the compensation layer has a first surface that abuts the piezoelectric layer and a second surface that abuts the substrate layer;
the first portion includes the first surface;
the second portion includes the second surface; and
the compensation layer has a gradient density that increases from the first density to the second density across a thickness of the compensation layer.

5. The apparatus of claim 1, wherein:
the compensation layer comprises a dielectric film; and
the first density and the second density are less than a density of the piezoelectric layer.

6. The apparatus of claim 1, wherein the second density is at least 20% greater than the first density.

7. The apparatus of claim 6, wherein the second density is at least 40% greater than the first density.

8. The apparatus of claim 1, wherein the first portion of the compensation layer and the second portion of the compensation layer comprise a same material.

9. The apparatus of claim 1, wherein the first portion of the compensation layer and the second portion of the compensation layer comprise different materials.

10. The apparatus of claim 1, wherein:
the first portion of the compensation layer has a first doping concentration with an element;
the second portion of the compensation layer has a second doping concentration with the element; and
the second density is greater than the first density based on the second doping concentration being greater than the first doping concentration.

11. The apparatus of claim 1, wherein the compensation layer further comprises a silicon oxynitride material.

12. The apparatus of claim 1, wherein the compensation layer further comprises a silicon nitride material.

13. The apparatus of claim 1, wherein:
the SAW filter comprises multiple cascaded resonators; and
a resonator of the multiple cascaded resonators comprises the piezoelectric layer, the compensation layer, and the substrate layer.

14. The apparatus of claim 1, further comprising:
a wireless transceiver coupled to at least one antenna, the wireless transceiver comprising the SAW filter and configured to filter, using the SAW filter, a wireless signal communicated via the at least one antenna.

15. The apparatus of claim 1, wherein the SAW filter comprises a thin-film SAW filter.

16. The apparatus of claim 1, wherein the fluorine doped silicon oxide material comprises a silicon oxide material with a doping concentration of fluorine.

17. An apparatus comprising:
an interdigital transducer;
at least one surface-acoustic-wave (SAW) filter comprising:
a piezoelectric layer;
a substrate layer; and
compensation means for suppressing a spurious mode of the SAW filter associated with reflections at a first surface of the compensation means and at a second surface of the compensation means, the compensation means comprising a first portion including a silicon oxide material having a first density at the first surface and a second portion including a fluorine doped silicon oxide material having a second density at the second surface, the second density being greater than the first density, the compensation means positioned between the piezoelectric layer and the substrate layer such that the first surface is proximate to the piezoelectric layer and the second surface is proximate to the substrate layer.

18. The apparatus of claim 17, wherein the compensation means comprises means for enabling the SAW filter to achieve a target temperature coefficient of frequency.

19. The apparatus of claim 17, wherein the first density and the second density are less than a density of the piezoelectric layer.

20. The apparatus of claim 17, wherein the second density is at least 20% greater than the first density.

21. A method of manufacturing a surface-acoustic-wave filter, the method comprising:
providing an interdigital transducer;
providing a substrate layer; and
providing a compensation layer on a surface of the substrate layer, the compensation layer having a first surface and a second surface that is opposite the first surface, the providing of the compensation layer comprising:
forming the compensation layer such that a density of a first portion of the compensation layer including a silicon oxide material is higher at the second surface relative to a second portion of the compensation layer including a fluorine doped silicon oxide material at the first surface; and
providing a piezoelectric layer on the first surface of the compensation layer.

22. The method of claim 21, wherein the forming of the compensation layer comprises forming multiple sublayers of the compensation layer, the multiple sublayers associated with different densities.

23. The method of claim 21, wherein the forming of the compensation layer comprises causing the compensation layer to have a gradient density that decreases across a thickness of the compensation layer from the second surface to the first surface.

24. The method of claim 21, wherein the forming of the compensation layer comprises performing at least one of the following:
a physical vapor deposition process; or
a chemical vapor deposition process.

25. The method of claim 21, further comprising:
providing a piezoelectric layer on the first surface of the compensation layer; and
providing an electrode structure on a surface of the piezoelectric layer, the electrode structure comprising the interdigital transducer.

26. An apparatus comprising:
an interdigital transducer;
a piezoelectric layer;
a substrate layer; and
a compensation layer disposed on a side of the substrate layer, the compensation layer comprising two surfaces on opposite sides of the compensation layer, the two surfaces comprising:
a first surface including a silicon oxide material having a first density; and
a second surface including a fluorine doped silicon oxide material having a second density that is greater than the first density, the second surface closer to the substrate layer as compared to the first surface.

27. The apparatus of claim 26, wherein:
the substrate layer comprises a silicon material; and
the compensation layer further comprises at least one of the following:
   a silicon oxynitride material; or
   a silicon nitride material.

28. The apparatus of claim 27, wherein:
the compensation layer comprises at least one of the following:
   the silicon oxide material doped with at least one first element;
   the silicon oxynitride material doped with at least one second element; or
   the silicon nitride material doped with at least one third element; and
the at least one first element, the at least one second element, and the at least one third element each comprise at least one of the following:
carbon;
chlorine;
fluorine;
hydrogen; or
phosphorous.

29. The apparatus of claim 26, further comprising a surface-acoustic-wave filter comprising:
   the piezoelectric layer, wherein the piezoelectric layer is disposed on the first surface of the compensation layer;
   the compensation layer; and
   the substrate layer.

30. The apparatus of claim 26, wherein the fluorine doped silicon oxide material comprises a silicon oxide material with a doping concentration of fluorine.

* * * * *